(12) United States Patent
Moscaluk et al.

(10) Patent No.: US 7,158,429 B1
(45) Date of Patent: Jan. 2, 2007

(54) SYSTEM FOR READ PATH ACCELERATION

(75) Inventors: Gary Peter Moscaluk, Colorado Springs, CO (US); John Eric Gross, Monument, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 152 days.

(21) Appl. No.: 10/801,432

(22) Filed: Mar. 16, 2004

Related U.S. Application Data

(60) Provisional application No. 60/457,750, filed on Mar. 26, 2003.

(51) Int. Cl.
*G11C 7/00* (2006.01)

(52) U.S. Cl. .................. 365/205; 365/233; 365/189.01

(58) Field of Classification Search ................ 365/205, 365/233, 189.01
See application file for complete search history.

(56) References Cited

U.S. PATENT DOCUMENTS

| | | | |
|---|---|---|---|
| 6,002,615 A * | 12/1999 | Sawada | 365/189.01 |
| 6,115,321 A * | 9/2000 | Koelling et al. | 365/233 |
| 6,542,424 B1 * | 4/2003 | Endo et al. | 365/205 |
| 6,728,142 B1 * | 4/2004 | Merritt et al. | 365/189.05 |

* cited by examiner

*Primary Examiner*—David Lam
(74) *Attorney, Agent, or Firm*—Dale B. Halling

(57) ABSTRACT

A system for read path acceleration has a first strobe reset circuit coupled to a first local amplifier. A second strobe reset circuit is coupled to a second local amplifier. A main amplifier is coupled to an output of the first local amplifier and an output of the second local amplifier.

18 Claims, 5 Drawing Sheets

US 7,158,429 B1

SYSTEM FOR READ PATH ACCELERATION

RELATED APPLICATIONS

The present invention claims priority on provisional patent application Ser. No. 60/457,750, filed on Mar. 26, 2003, entitled "Readpath Optimization Scheme for Low-Voltage, High Speeds Chips" and assigned to the same assignee as the present application.

FIELD OF THE INVENTION

The present invention relates generally to the field of electronic circuits and more particularly to a system for read path acceleration.

BACKGROUND OF THE INVENTION

In electronic circuits, designers are faced with the challenge of transmitting signals over long distances on integrated circuits for instance. This problem is exacerbated by the increasing clock speed of integrated circuits and the increased complexity of the circuits. One example of this problem is the read path signals of a memory core integrated circuit.

FIG. 1 shows an exemplary embodiment of conventional solution 10 to the read path problem in a memory core. The diagram shows the signal path of a strobe global word line input (gwlstrobe) 12 through a number of RC (resistance capacitance) delays 14, 16 to a buffer 18. The output 20 of the buffer 18 is the global strobe buffer signal (gwlstrbuf). This signal 20 is distributed to the memory array and used as a timing signal for the local amplifiers 22, 24, 26. The rising edge of the global strobe buffer signal 20 causes the local amplifier strobe circuits 28, 30, 32 to trigger and enable on the local amplifiers 22, 24, 26. The local amplifiers 22, 24, 26 store the correct logic level based on the bit line differential bl 34 and blb 36. The local amplifiers 22, 24, 26 then drive the gdrd (global read data) lines 38, 40. The output register 42 must latch before the equalization circuit 44 resets the values on the gdrd lines 38 & 40 and before the local amplifier 22, 24, 26 are turned off by the falling edge of the global strobe buffer 20 signal. Failure of these timing requirements can cause virtual data or a crowbar situation for the local amplifiers 22, 24, 26. One solution is to increase the time the local amplifiers have to present the data to the gdrd lines, however this slows down the read access time.

Thus there exists a need for a read path acceleration system that allows fast access of the data without the risk of virtual data or crowbar situations.

SUMMARY OF INVENTION

A system for read path acceleration that overcomes these problems has a memory core divided into a number of segments. Each segment has a number of local amplifiers coupled to a pair of global read data lines. A main amplifier has an input coupled to the pair of global read data lines and has an output coupled to an output register. In one embodiment, a main amplifier strobe is coupled to each segment of a number of local strobe reset circuits. A second main amplifier strobe may be coupled to the main amplifier. In one embodiment, the second main amplifier is coupled to an equalization circuit.

In one embodiment, a local strobe reset circuit is coupled to the local amplifier. The local strobe reset circuit may have an input coupled to the main amplifier strobe. The local strobe reset circuit may have an input coupled to a local amplifier strobe.

In one embodiment, a system for read path acceleration has a number of strobe reset circuits. A number of local amplifier strobe circuits having their input coupled to an output of one of the strobe reset circuits. The strobe reset circuits may have an input coupled to a strobe off signal from the local amplifier strobe circuits. A main amplifier strobe circuit may be coupled to an input of the strobe reset circuits. In one embodiment, the strobe reset circuits delay a rising edge of a global strobe end signal from the main amplifier strobe circuit.

In one embodiment, a main amplifier is coupled to a pair of global read data lines. The pair of global read data lines are coupled to all local amplifiers and each local amplifier is coupled to the local amplifier strobe circuits. A second main amplifier strobe circuit may be coupled to the main amplifier. The main amplifier strobe may delay a rising edge of a global word strobe signal. The main amplifier strobe may not delay a falling edge of the global word strobe signal.

In one embodiment, a system for read path acceleration includes a first strobe reset circuit coupled to a first local amplifier. A second strobe reset circuit is coupled to a second local amplifier. A main amplifier is coupled to an output of the first local amplifier and an output of the second local amplifier. A first delay between the main amplifier and the first local amplifier may be different from a second delay between the main amplifier and the second local amplifier. A main amplifier strobe circuit may be coupled to the first strobe reset circuit and the second strobe reset circuit. In one embodiment, a second main amplifier strobe circuit is coupled to the main amplifier. An equalization circuit may be coupled to the main amplifier strobe circuit.

DETAILED DESCRIPTION OF THE DRAWINGS

Figure 1:
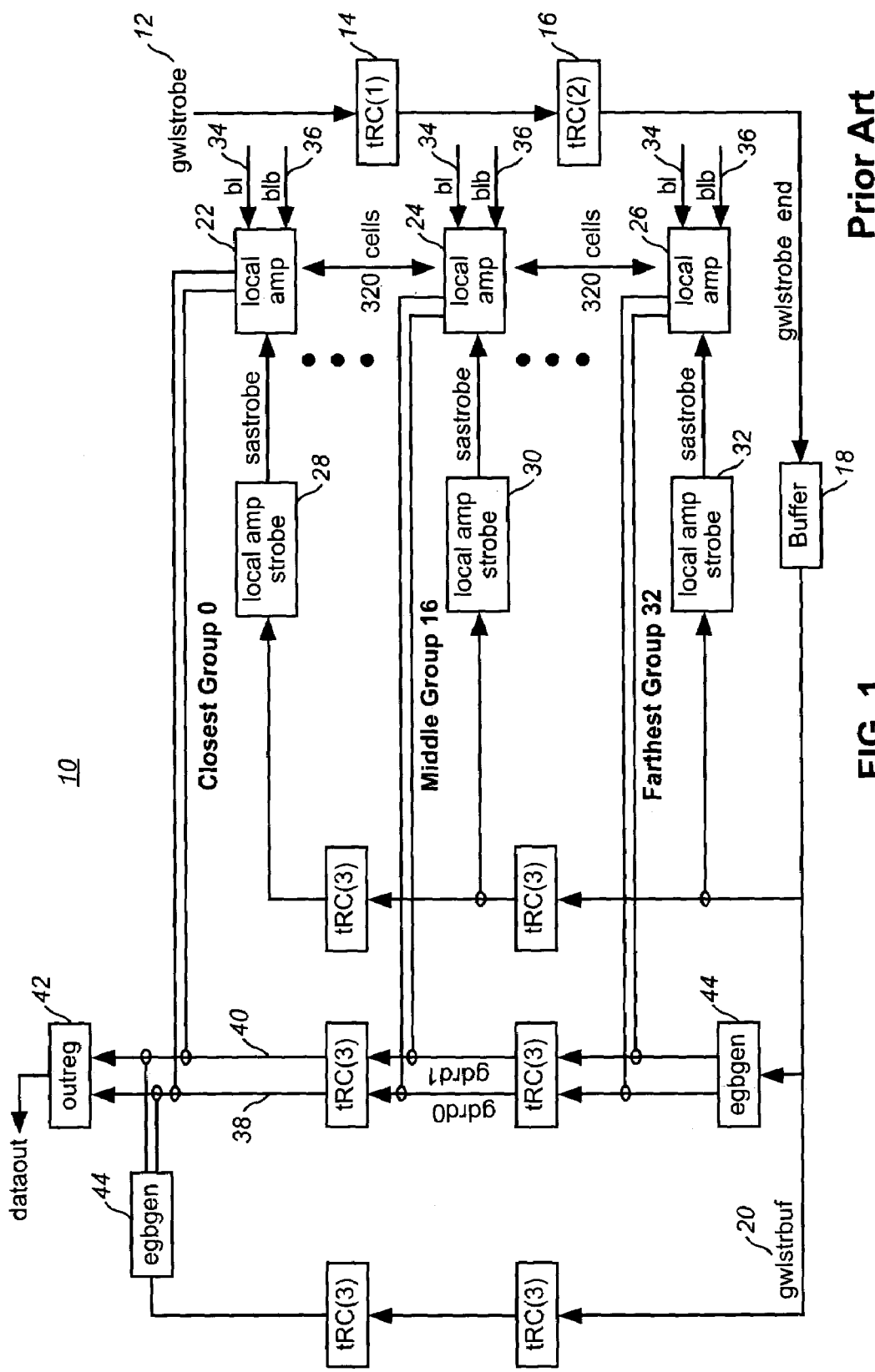
FIG. 1 is an exemplary embodiment of conventional solution 10 to the read path problem in a memory core.
Figure 2:
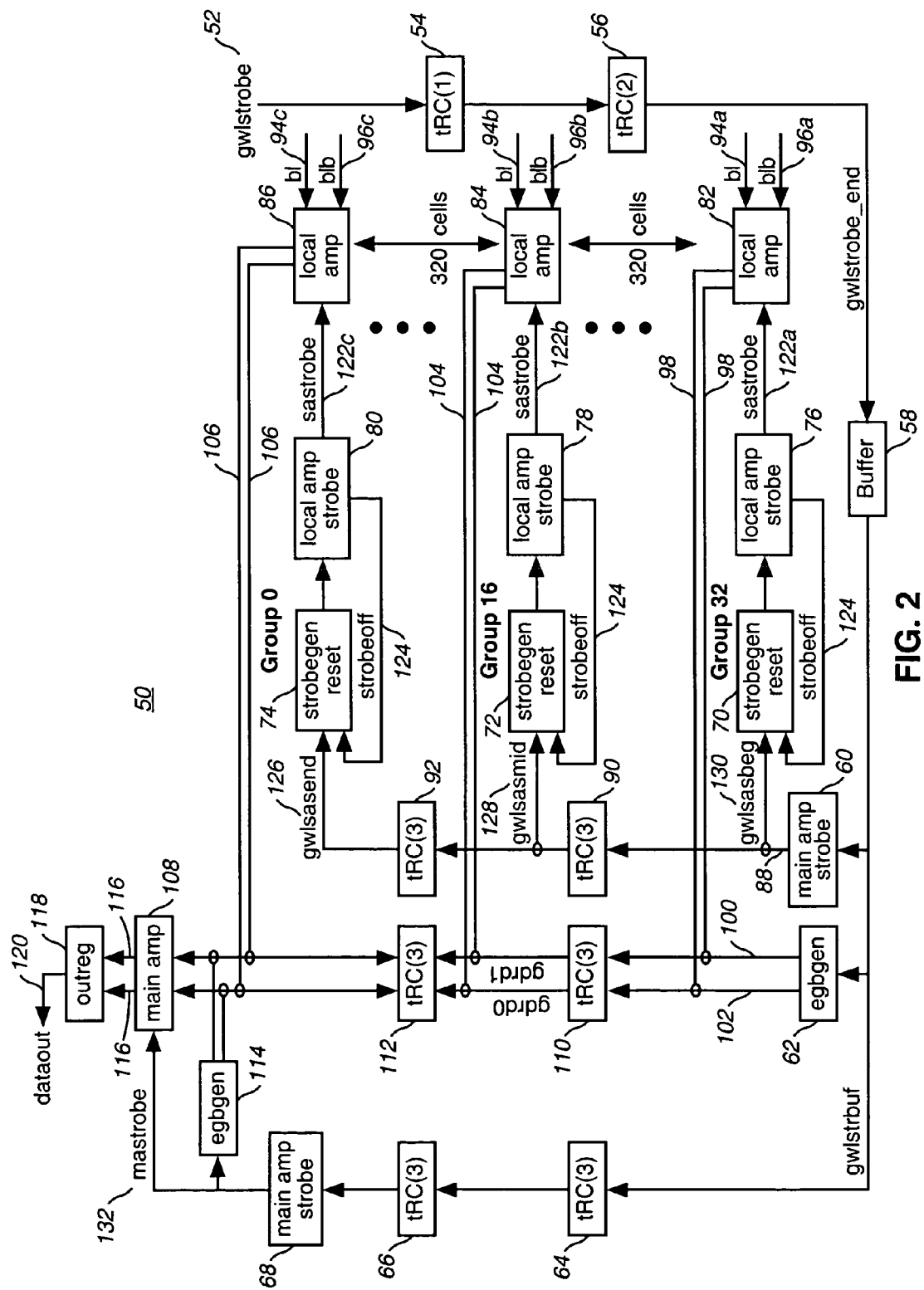
FIG. 2 is a block diagram of a system for read path acceleration in accordance with one embodiment of the invention.

A system for read path acceleration for a memory core of an integrated circuit, reduces the read access time without modifying the clock speed which decreases the risk of virtual data or other read failures. This is accomplished by reducing the margins required for each step in the read process. FIG. 2 is a block diagram of a system 50 for read path acceleration in accordance with one embodiment of the invention. The global strobe word line (gwlstrobe) 52 is coupled through a number of RC (Resistance Capacitance) delays 54, 56 to a buffer 58. The buffer 58 is coupled to a first main amplifier strobe circuit 60 an equalization circuit 62 and through a number of RC (Resistance Capacitance) delays 64, 66 to a second main amplifier strobe circuit 68. The first main amplifier strobe circuit 60 is coupled to a strobe reset circuit 70 in the group 32 memory segment, to a strobe reset circuit 72 in the group 16 memory segment, and to a strobe reset circuit 74 in the group 0 memory segment. The strobe reset circuit 70 is coupled to a local amplifier strobe circuit 76. The strobe reset circuit 72 is coupled to a local amplifier strobe circuit 78. The strobe reset circuit 74 is coupled to a local amplifier strobe circuit 80. The local amplifier strobe circuit 76 is coupled to local amplifier 82. The local amplifier strobe circuit 78 is coupled to local amplifier 84. The local amplifier strobe circuit 80 is coupled to local amplifier 86. Note that there actually a number of local amplifiers in each memory segment. Note that the output 88 of the first main amplifier strobe circuit 60 has to pass through one lumped RC (Resistance Capacitance) delay 90 to reach the group 16 memory segment and another lumped RC (Resistance Capacitance) delay 92 to reach the group 0 memory segment. The RC (Resistance Capacitance) delays are actually the result of the long traces the signals have to propagate through but are represented as lumped RC (Resistance Capacitance) delays.

The local amplifier 82 is coupled to bit line (bl) 94*a* and bit line bar (blb) 96*a*. The local amplifier 84 is coupled to bit line (bl) 94*b* and bit line bar (blb) 96*b*. The local amplifier 84 is coupled to bit line (bl) 94*c* and bit line bar (blb) 96*c*. The output 98 of local amplifier 82 is coupled to gdrd (global read data lines) 100 & 102. The output 104 of local amplifier 84 is coupled to global read data lines 100 & 102. The output 106 of local amplifier 86 is coupled to global read data lines 100 & 102. The global read data lines 100, 102 are coupled to a main amplifier 108. The outputs 98, 104 and 106 are differential outputs and drive the differential global read data lines 100 & 102. Note that the output 98 of the local amplifier 98 has to travel through two RC (Resistance Capacitance) delays 110, 112. Also note that the output 104 of local amplifier 84 has to travel through one RC (Resistance Capacitance) delay 112. As explained above, the RC (Resistance Capacitance) delays are actually the result of the long traces the signals have to propagate through but are represented as lumped RC (Resistance Capacitance) delays. The main amplifier 108 is controlled by the second main amplifier strobe circuit 68, which also controls the equalization circuit 114. The output 116 of the main amplifier 108 is coupled to the output register 118. The output 120 of the output register 118 is the latched data output signal.

In operation one of the bit lines 94*a–c* and one of the bit line bars 96*a–c* are activated by a local word line. The local amplifier strobe circuit 76 has a sense amplifier strobe signal 122*a* that is initiated by a local word line strobe timing signal that turns on the local amplifier 76 when it goes high. The local amplifier strobe circuit 78 has a sense amplifier strobe signal 122*b* that is initiated by a local word line strobe timing signal that turns on the local amplifier 78 when it goes high. The local amplifier strobe circuit 80 has a sense amplifier strobe signal 122*c* that is initiated by a local word line strobe timing signal that turns on the local amplifier 80 when it goes high. Note that only one local amplifier per segment are active in any given memory access. The local amplifier strobe circuit 76 is controlled, thereafter, by the strobe reset circuit 70. The local amplifier strobe circuit 78 is controlled, thereafter, by the strobe reset circuit 72. The local amplifier strobe circuit 80 is controlled, thereafter, by the strobe reset circuit 74. The strobe reset circuit 76, activates based on both the strobe off signal (strobeoff) 124 being high and the output 88 from the first main amplifier strobe circuit 60 being high. The strobe reset circuit 78 activates based on both the strobe off signal (strobeoff) 124 being high and the output 88 from the first main amplifier strobe circuit 60 being high. The strobe reset circuit 80 activates based on both the strobe off signal (strobeoff) 124 being high and the output 88 from the first main amplifier strobe circuit 60 being high. Note that the output from the main amplifier strobe circuit 88 is broken into three signals global word end (gwlsasend) 126, global word middle (glwsasmid) 128 and global word begin (glwsasbeg) 130. The first main amplifier strobe circuit 60 delays the rising edge of the output of the buffer 58. This ensures that the local amplifiers 82, 84, 86 stay on until the main amplifier 108 is on. The output 88 of the first main amplifier strobe circuit 60 must transition high regardless of the logic state of buffer output. This insures that the local amplifier has sufficient time to transfer the correct data to the global read data lines and latch the data in the main amplifier 108. The second main amplifier strobe 68 has an output master strobe 132 that controls the main amplifier 108. The second main amplifier strobe circuit 68 ensures that the main amplifier 108 turns on when one of the local amplifiers 82, 84, 86 are on. The equalization circuits 62 and 114 are activated by the output of the buffer and the second main amplifier strobe circuit 68. Using two equalization circuits 62 and 114 reduces the time to equalize the global data read lines and makes the middle of the global read data lines the worst case for equalization. This technique reduces the allowed time for equalization approximately in half.

Figure 3:
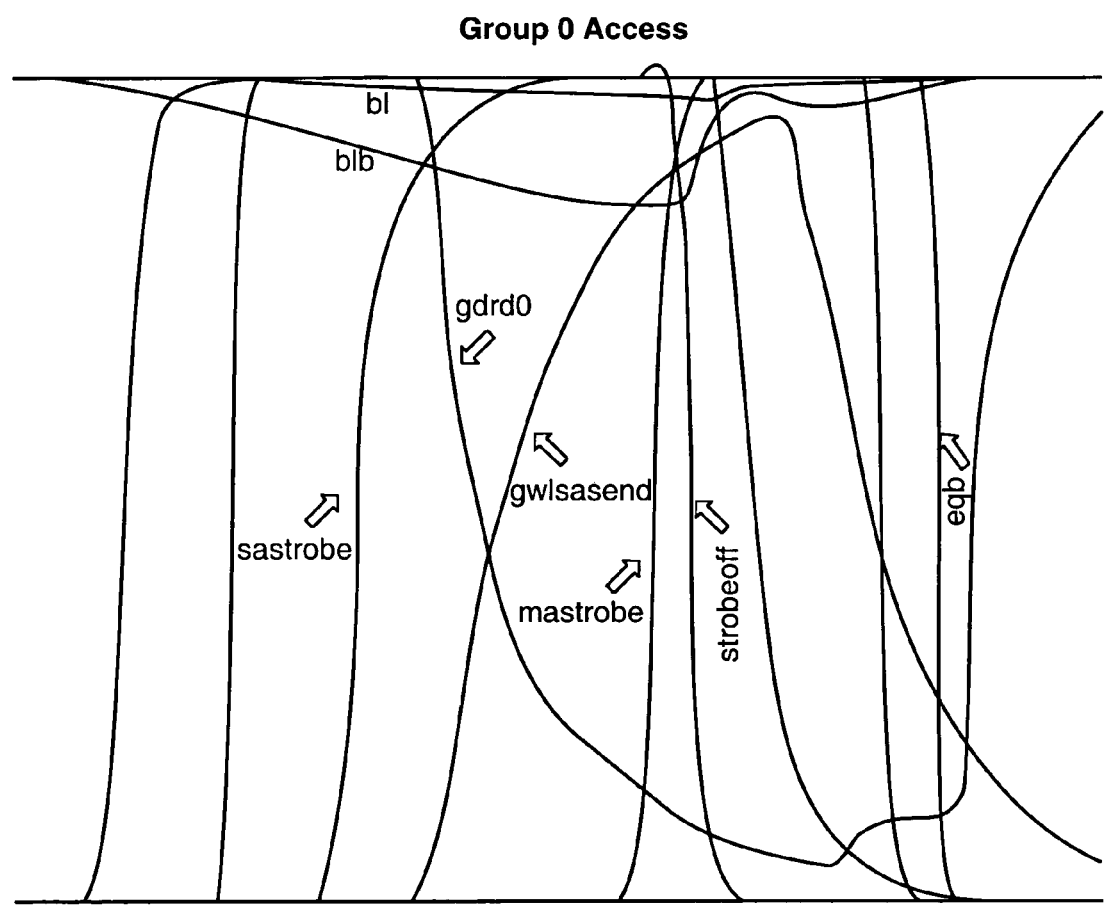
FIG. 3 is a timing diagram for group 0 memory segment in accordance with one embodiment of the invention.

FIG. 3 is a timing diagram for group 0 memory segment in accordance with one embodiment of the invention. As can be seen in the top of the graph, the bit line (bl) 94*c* and bit line bar (blb) 96*c* start to separate in voltage following equalization and local word line enabling. The sense amplifier strobe signal (sastrobe) 122*a* starts transitioning high which turns on the local amplifier 86. The sense amplifier strobe signal goes high based on a local word line strobe timing signal. Next, the signal global word sense amplifier strobe end (gwlsasend) 126 starts to go high. This signal 126 along with the feedback signal (strobeoff) 124 allows for the strobe reset circuit 80 to turn off the local amplifier 86. However, before the strobeoff signal 124 goes low the mastrobe signal 132 goes high turning on the main amplifier 108. Some time there after the eqb (equalization) signal equalizes the global read data lines (gdrd) 100 & 102. As can be seen this scheme allows for a robust bit line differential, causes the main amplifier to sense before the local amplifier is disabled and disables the local amplifier before equalization of the global read data lines. This prevents virtual data and prevents a crowbar condition on the local amplifier.

Figure 4:
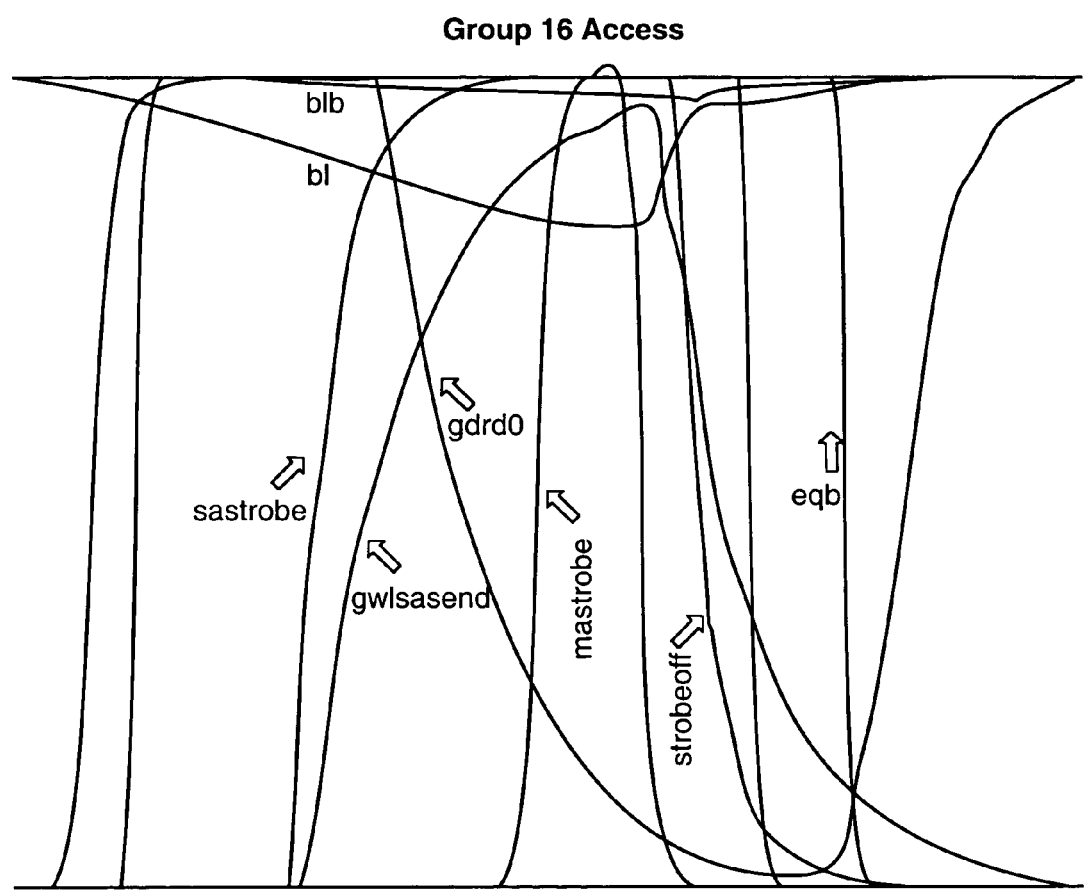
FIG. 4 is a timing diagram for group 16 memory segment in accordance with one embodiment of the invention.

FIG. 4 is a timing diagram for group 16 memory segment in accordance with one embodiment of the invention. As can be seen in the top of the graph, the bit line (bl) 94*b* and bit line bar (blb) 96*b* start to separate in voltage following equalization and local word line enabling. The sense amplifier strobe signal (sastrobe) 122*b* starts transitioning high which turns on the local amplifier 84. The sense amplifier strobe signal goes high based on a local word line strobe timing signal. Next, the signal global word sense amplifier middle (gwlsasmid) 128 starts to go high. This signal 128 along with the feedback signal (strobeoff) 124 allows for the strobe reset circuit 78 to turn off the local amplifier 84. However, before the strobeoff signal 124 goes low the mastrobe signal 132 goes high turning on the main amplifier 108. However, before the strobeoff signal 124 goes low the mastrobe signal 132 goes high turning on the main amplifier 108. Some time there after the eqb (equalization) signal equalizes the global read data lines (gdrd) 100 & 102. As can be seen this scheme allows for a robust bit line differential, causes the main amplifier to sense before the local amplifier is disabled and disables the local amplifier before equalization of the global read data lines. This prevents virtual data and prevents a crowbar condition on the local amplifier. Note that the timing diagram of FIG. 4 is similar to that of FIG. 3 except that the output signal 88 from the main strobe amplifier 60 is delayed less than global word sense amplifier end (gwlsasend) and is labeled gwlsasmid (global word middle) 128. As a result, the delay created by the strobe reset circuit 72 must be greater than the delay created by the strobe reset circuit 74.

Figure 5:
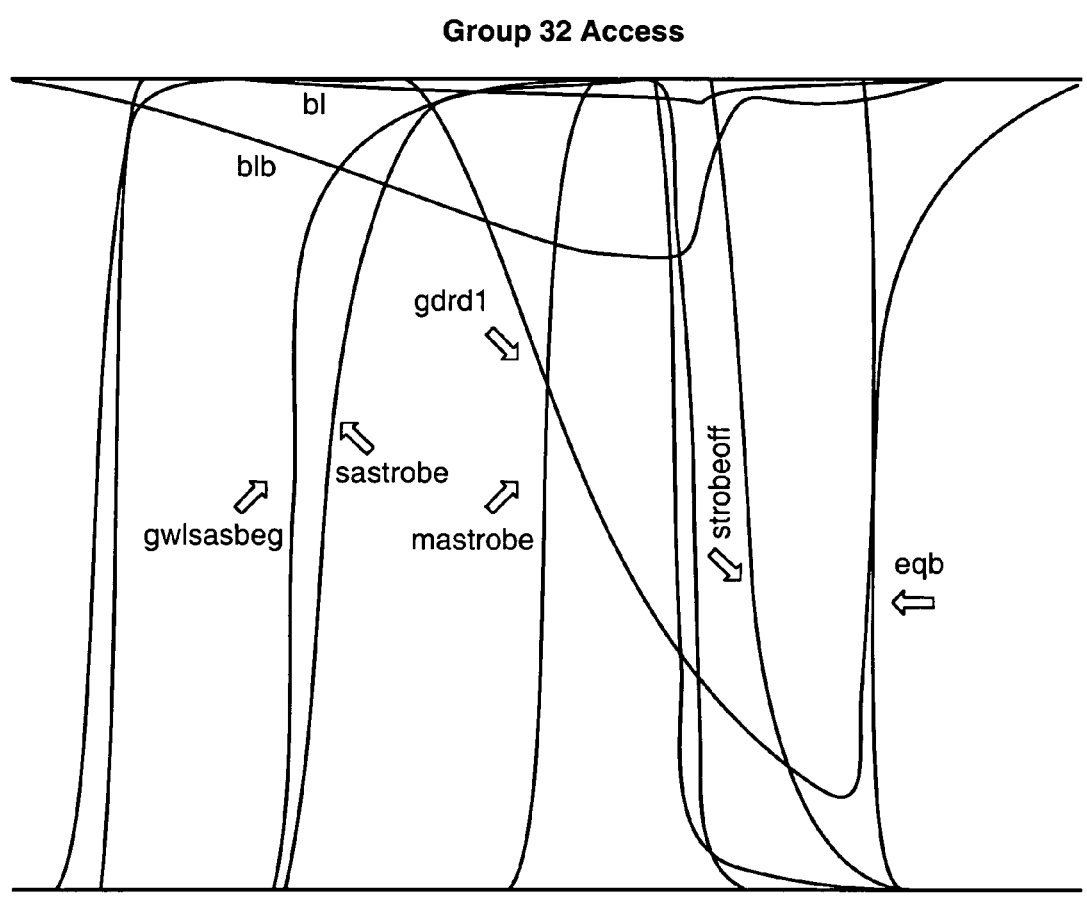
FIG. 5 is a timing diagram for group 32 memory segment in accordance with one embodiment of the invention.

FIG. 5 is a timing diagram the group 32 memory segment in accordance with one embodiment of the invention. As can be seen in the top of the graph, the bit line (bl) 94a and bit line bar (blb) 96a start to separate in voltage following equalization and local word line enabling. The sense amplifier strobe signal (sastrobe) 122s starts transitioning high which turns on the local amplifier 82. The sense amplifier strobe signal goes high based on a local word line strobe timing signal. Next, the signal global word sense amplifier begin (gwlsasbeg) 130 starts to go high. This signal 130 along with the feedback signal (strobeoff) 124 allows for the strobe reset circuit 76 to turn off the local amplifier 82. However, before the strobeoff signal 124 goes low the mastrobe signal 132 goes high turning on the main amplifier 108. However, before the strobeoff signal 124 goes low the mastrobe signal 132 goes high turning on the main amplifier 108. Some time there after the eqb (equalization) signal equalizes the global read data lines (gdrd) 100 & 102. As can be seen this scheme allows for a robust bit line differential, causes the main amplifier to sense before the local amplifier is disabled and disables the local amplifier before equalization of the global read data lines. This prevents virtual data and prevents a crowbar condition on the local amplifier. The timing diagram of FIG. 5 is similar to that of FIGS. 3 & 4 except that the output signal 88 from the main strobe amplifier 60 is delayed less than global word middle (gwlsamid) and is labeled gwlsasbeg (global word begin) 128. As a result, the delay created by the strobe reset circuit 70 must be greater than the delay created by the strobe reset circuits 74 & 72. Note that the actual delays depend on the particular line routing layout configuration and must be adjusted accordingly.

The system design for the read path acceleration is motivated by increasing the read path acceleration while avoiding the problems of virtual data and crowbar effects. Three main elements have been adjusted to allow this to occur in the present design. One is that the falling edge or the signal to turn off the local amplifiers is controlled by the strobe reset generator instead by the strobe global word line (gwlstrobe) 52. This ensures that the local amplifier does not turn off before the main amplifier 108 turns on. This avoids the problem of virtual data. Second is that by having an equalization generator 114 that is controlled by the second main amplifier strobe circuit 68, it is possible to ensure that the equalization generator 114 does not activate while the main amplifier or local amplifiers are on and result in a crowbar situation. Third the equalization of the global data read lines is driven from both ends. This reduces the time required for equalization and allows the next read to start sooner. The combination of these three main elements allows for more precise timing between the local amplifiers, main amplifier and equalization circuits. As a result, less margin is required for the read path process which speeds up the read path.

Thus there has been described a system for read path acceleration, that allows fast access of the data without the risk of virtual data or crowbar situations. Because the delays can be adjusted for different designs the system may be adjusted to obtain the largest margins over process, voltage and temperature variations.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A system for read path acceleration, comprising:
   a memory core divided into a plurality of segments each segment having a plurality of local amplifiers each coupled to a pair of global read data lines;
   a main amplifier having an input coupled to the pair of global read data lines and having an output coupled to an output register; and
   a main amplifier strobe coupled to each of the plurality of local amplifiers.

2. The system of claim 1, further including a second main amplifier strobe coupled to the main amplifier.

3. The system of claim 2, wherein the second main amplifier strobe is coupled to an equalization circuit.

4. The system of claim 1, further including a local strobe reset circuit coupled to a local amplifier of the plurality of local amplifiers.

5. The system of claim 4, wherein the local strobe reset circuit has an input coupled to the main amplifier strobe.

6. The system of claim 5, wherein the local strobe reset circuit has an input coupled to a local amplifier strobe.

7. A system for read path acceleration, comprising:
   a plurality of strobe reset circuits; and
   a plurality of local amplifier strobe circuits each having an input coupled to an output of one of the plurality of strobe reset circuits, wherein each of the plurality of strobe reset circuits has an input coupled to a strobe off signal from each of the plurality of local amplifier strobe circuits.

8. The system of claim 7, further including a main amplifier strobe circuit coupled to an input of each of the plurality of strobe reset circuits.

9. The system of claim 8, wherein each of the plurality of strobe reset circuits delays a rising edge of a global strobe end signal from the main amplifier strobe circuit.

10. The system of claim 8, wherein the main amplifier strobe delays a rising edge of a global word strobe signal.

11. The system of claim 10, wherein the main amplifier strobe does not delay a falling edge of the global word strobe signal.

12. The system of claim 7, further including a main amplifier coupled to a pair of global read data lines, the pair of global read data lines coupled to a local amplifier coupled to one of the plurality of local amplifier strobe circuits.

13. The system of claim 12, further including a second main amplifier strobe circuit coupled to the main amplifier.

14. A system for read path acceleration, comprising:
   a first strobe reset circuit coupled to a first local amplifier;
   a second strobe reset circuit coupled to a second local amplifier; and
   a main amplifier couple to an output of the first local amplifier, an output of the second local amplifier and a pair of global read data lines.

15. The system of claim 14, wherein a first delay between the main amplifier and the first local amplifier is different from a second delay between the main amplifier and the second local amplifier.

16. The system of claim 14, further including a main amplifier strobe circuit coupled to the first strobe reset circuit and the second strobe reset circuit.

17. The system of claim 16, further including a second main amplifier strobe circuit coupled to the main amplifier.

18. The system of claim 17, further including an equalization circuit coupled to the main amplifier strobe circuit.

* * * * *